(12) United States Patent
Roberts, Jr.

(10) Patent No.: US 10,197,622 B2
(45) Date of Patent: Feb. 5, 2019

(54) MODULAR MULTIPLEXING INTERFACE ASSEMBLY FOR REDUCING SEMICONDUCTOR TESTING INDEX TIME

(71) Applicant: CELERINT, LLC., New York, NY (US)

(72) Inventor: Howard H. Roberts, Jr., Austin, TX (US)

(73) Assignee: CELERINT, LLC., New York, NY (US)

( * ) Notice: Subject to any disclaimer, the term of this patent is extended or adjusted under 35 U.S.C. 154(b) by 75 days.

(21) Appl. No.: 15/115,796

(22) PCT Filed: Feb. 3, 2015

(86) PCT No.: PCT/US2015/014209
§ 371 (c)(1),
(2) Date: Aug. 1, 2016

(87) PCT Pub. No.: WO2015/119928
PCT Pub. Date: Aug. 13, 2015

(65) Prior Publication Data
US 2017/0168111 A1   Jun. 15, 2017

Related U.S. Application Data

(60) Provisional application No. 61/935,517, filed on Feb. 4, 2014.

(51) Int. Cl.
*G01R 31/28* (2006.01)

(52) U.S. Cl.
CPC ..... *G01R 31/2867* (2013.01); *G01R 31/2834* (2013.01); *G01R 31/2893* (2013.01)

(58) Field of Classification Search
CPC .................... G01R 31/28–31/31937
See application file for complete search history.

(56) References Cited

U.S. PATENT DOCUMENTS

| 5,310,039 A | * | 5/1994 | Butera | G01R 31/2851 |
| | | | | 198/346.2 |
| 6,242,899 B1 | * | 6/2001 | Miller | G01R 13/345 |
| | | | | 324/76.24 |

(Continued)

OTHER PUBLICATIONS

International Search Report and Written Opinion, dated May 11, 2015, in International Application No. PCT/US2015/014209.

*Primary Examiner* — Huy Q Phan
*Assistant Examiner* — David Frederiksen
(74) *Attorney, Agent, or Firm* — Greenblum & Bernstein, P.L.C.

(57) ABSTRACT

A modular multiplexing interface assembly and corresponding methodology are provided for reducing semiconductor testing index time in automated semiconductor test equipment using robotic handlers. The modular multiplexing interface assembly includes a modular printed circuit multiplexing motherboard that attaches to the automated semiconductor test equipment, and a plurality of modular load boards, each modular load board being detachably connected, electrically and mechanically, to a robotic handler. The modular multiplexing interface assembly also includes a plurality of electrical cable bundles, each electrical cable bundle electrically connecting the printed circuit motherboard with one of the plurality of modular load boards, wherein the plurality of electrical cable bundles are trace-length matched for a designated digital signal.

17 Claims, 8 Drawing Sheets

(56) References Cited

U.S. PATENT DOCUMENTS

| | | | |
|---|---|---|---|
| 6,804,620 B1* | 10/2004 | Larson | G01R 31/3191 |
| | | | 324/750.02 |
| 6,856,862 B1 | 2/2005 | Feltner | |
| 7,183,785 B2 | 2/2007 | Roberts et al. | |
| 7,508,191 B2 | 3/2009 | Roberts | |
| 7,619,432 B2 | 11/2009 | Roberts | |
| 8,400,180 B2 | 3/2013 | Roberts | |
| 2006/0061377 A1 | 3/2006 | Roberts et al. | |
| 2007/0103213 A1 | 5/2007 | Wood | |
| 2007/0126438 A1 | 6/2007 | Tang | |
| 2007/0126448 A1* | 6/2007 | Hubscher | G01R 31/2886 |
| | | | 324/756.01 |
| 2009/0276175 A1* | 11/2009 | Lee | G01R 31/2894 |
| | | | 702/82 |
| 2010/0323536 A1 | 12/2010 | Crane, Jr. et al. | |
| 2011/0204914 A1 | 8/2011 | Roberts | |
| 2014/0159743 A1* | 6/2014 | Dayal | G01F 23/284 |
| | | | 324/649 |

* cited by examiner

MODULAR MULTIPLEXING INTERFACE ASSEMBLY FOR REDUCING SEMICONDUCTOR TESTING INDEX TIME

CROSS-REFERENCE TO RELATED APPLICATION

This application claims the benefit of U.S. Provisional Patent Application No. 61/935,517, entitled Multiplexing Module For Index Time Reduction, filed on Feb. 4, 2014, the disclosure of which is incorporated by reference herein in its entirety.

TECHNICAL FIELD

The present disclosure is related to automatic test equipment and robotic handlers. In particular, the present disclosure is related to a platform system for multiplexing more than one test site, and for reducing or eliminating index time in automatic test equipment.

BACKGROUND

Manufacturing and production industries use automatic test equipment (ATE) to analyze and assess integrity and operability of manufactured products at various stages of production. Robotic manipulator machines are often employed during testing by ATE to manipulate work pieces and products into and out of connection with the ATE. The devices under test (DUTs) are presented to a test site of the ATE by the robotic machine, tested by the ATE, and then sorted and dispensed by the robotic machine into groups or bins (or otherwise according to an applicable scheme) according to test results. Because many diverse types of DUTs are tested by ATEs, and DUTs may be tested at various stages of production (e.g., final test, work piece probe, etc.), ATEs are varied in design according to the particular purpose, device, and/or product for testing. Similarly, robotic manipulator machines vary according to application and compatibility with the ATE.

Although varied, ATEs and robotic manipulators each usually include several typical operational units. ATEs and robotic manipulators are widely used, for example, in the production of electronic products, such as analog and digital components, circuits and devices (including semiconductors, integrated circuits, microprocessors, and the like). Because of this prevalence, the typical operational units of ATEs and robotic manipulators for such products are described.

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board") connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and controllers. The mechanical systems physically deliver DUTs for presentation to the socket(s) of the DIB connected to the test head of the ATE, deposit the DUTs in the socket(s) during testing, remove the DUTs from the socket(s) post testing, and sort the DUTs according to respective test result after testing. The controller directs operations of the mechanical systems of the handler and communicates with the ATE. As required, handlers can include additional features of memory and specific units according to application and testing environment.

In conventional testing of devices by an ATE and mechanical manipulation of devices by a handler, the ATE commences testing each device when deposited by the handler in a socket of the DIB connected to the test head. When testing is completed, the handler must remove the tested device from the socket and transport a next device to the socket for testing. The time delay between testing by the ATE, during which devices are removed and transported from sockets and next devices are transported to and deposited in sockets, is referred to as "index time" for the test operation. Further, in conventional testing of devices by an ATE, the time required to test each device once deposited in a socket is referred to as "tester time" for the test operation. When testing a batch of devices, the total time required for the testing operation is the aggregate of the index time plus the tester time for all of the devices. Each device (or set of devices, if more than one device can be concurrently tested by the ATE in available sockets of the DIB) requires the sum of the index time plus the tester time for testing of the device. Although testing operations can also require additional time, for example, because of downtime of equipment, faults, or other impediments to continuous testing sequence, these are irregular and uncertain events that are not necessarily controllable.

Therefore, reducing the total test time (index time plus tester time) is desirable. Testing operations can require significant amounts of time, effort and expense, such as for personnel, ATE, and handler equipment. ATEs are typically expensive because they are comprised of complex electronics. Handlers are generally less expensive than ATEs because mechanical pieces are controlled by less complex electronics. In efforts to receive greater returns on investments in ATEs and handlers, companies operating the equipment desire that idle times (periods of no testing) for this equipment be limited. Therefore, with ATEs and handlers, a reduction of total test time (index time plus tester time) can provide significant advantage. For example, if total test time is reduced, more testing can be performed by each piece of equipment and testing personnel during any period, leading to a greater investment return.

A primary focus in handler development has been to increase the speed of mechanical structures, such as arms, chucks, guides, cams and the like, in order to obtain shorter index times. Because handlers are generally less expensive than ATEs, older handler models are replaced with newer, speedier models. Older handlers become idle and obsolete. Handler mechanical failure is a significant source of testing downtime; therefore, excess handlers are often maintained as backup equipment, but stand idle during periods not in use with ATE for testing operations. It would be desirable to reduce total test time by the more effective and efficient use of ATEs and available handlers.

It would, therefore, be advantageous to reduce total test time for testing by reducing index time of handler/robotic manipulator operations. It would also be advantageous to efficiently use ATE resources and available handlers to put to use idle equipment, maximize use of equipment capabilities, take advantage of available capacity (including capacity from existing older equipment), and consequently, provide a better return on investment. Therefore, a platform system for reducing total test time, by decreasing handler index time and efficiently using automatic test equipment resources, would be a significant improvement in the art and technology.

A system and method for minimizing index time has been described in Assignee's existing patents, including U.S. Pat. No. 7,183,785 B2, U.S. Pat. No. 7,508,191 B2, U.S. Pat. No. 7,619,432 B2, and U.S. Pat. No. 8,400,180 B2, wherein tester resources are multiplexed in an alternating manner between two or more handlers operating in such a way as to reduce the index time to insignificance. For this strategy to be efficient and effective, a multiplexing circuit board (motherboard) that interfaces the tester to multiple handlers is required. This motherboard would typically be designed as a single integral assembly. One disadvantage of this approach is that when any one of the multiplexing components fails, the entire assembly is rendered useless until repaired. It would be advantageous to have the multiplexing components placed on a detachable module or daughter card so that in the event of a component failure, the defective module can simply be replaced and the multiplexing motherboard returned to service immediately. Furthermore, as any defective multiplexing components must be tested, a modular architecture would be advantageous in terms of facilitating the testing.

SUMMARY

There is provided a novel modular multiplexing interface assembly and related methodology for multiplexing robotic handlers in a semiconductor test cell using quickly replaceable multiplexing load modules. The disclosed design configuration and related features describe a set of control circuits and layouts that minimize the printed circuit board (PCB) area, pin count of the mating interconnects, and manufacturing cost.

Circuitry and PCB assembly are described for supporting the design of multiplexing interface hardware for semiconductor testing, which are designed to reduce or eliminate index time during testing. The disclosed embodiments incorporate innovative design elements for a modular multiplexing assembly that can be attached as one or more daughtercards to a motherboard interface PCB. The motherboard is a PCB assembly that attaches to a semiconductor tester as the electrical and mechanical interface between the tester and the device or devices under test. The disclosed embodiments simplify the design of multiplexing hardware and incorporate all of the required elements that are necessary to support semiconductor testing with reduced or negligible index time.

In an embodiment, a modular multiplexing interface assembly is provided for reducing semiconductor testing index time in automated semiconductor test equipment that uses robotic handlers. The modular multiplexing interface assembly includes a printed circuit multiplexing motherboard that attaches to the automated semiconductor test equipment, and a plurality of modular load boards, each modular load board being detachably connected, electrically and mechanically, to a robotic handler. The modular multiplexing interface assembly also includes a plurality of electrical cable bundles, each electrical cable bundle electrically connecting the printed circuit motherboard with one of the plurality of modular load boards, wherein the plurality of electrical cable bundles are trace-length matched for a designated digital signal.

In another embodiment, the plurality of electrical cable bundles are trace-length matched to a tolerance equal to or greater than a propagation speed of the designated digital signal, given the printed circuit multiplexing motherboard dielectric, times approximately $\frac{1}{6}$ of a rise time of the designated digital signal.

In a further embodiment, the plurality of electrical cable bundles are trace-length matched to a tolerance equal to or greater than a propagation speed of the designated digital signal, given the printed circuit multiplexing motherboard dielectric, times approximately $\frac{1}{6}$ of a fall time of the designated digital signal.

In an embodiment, the plurality of electrical cable bundles are trace-length matched to a tolerance equal to or greater than a propagation speed of the designated digital signal, given the printed circuit multiplexing motherboard dielectric, times approximately $\frac{1}{6}$ of a shortest time of a rise time and a fall time of the designated digital signal.

In another embodiment, the modular multiplexing interface assembly also includes a safety circuit being assigned to a designated robotic handler that prevents multiplexing relays for the designated robotic handler to actuate when the electrical cable bundle associated with the designated robotic handler becomes disconnected from the printed circuit multiplexing motherboard.

In a further embodiment, the safety circuit assigned to the designated robotic handler is located in a interlock circuit that connects the automated semiconductor test equipment with the designated robotic handler. The interlock circuit prevents the automated test equipment from powering up semiconductor tester resources that utilize electrical signals exceeding a predetermined voltage threshold.

In an embodiment, the safety circuit includes a special circuit. The special circuit interfaces with the designated interlock circuit for each of the robotic handlers and prevents a disconnected robotic handler from powering on, while enabling each connected robotic handler to continue testing operations.

In another embodiment, the modular multiplexing interface assembly includes a prevention circuit that prevents more than one robotic handler from being connected to a semiconductor tester of the automated semiconductor test equipment at a same time.

In a further embodiment, the prevention circuit includes a normally closed prevention relay that opens and disconnects power from relays associated with robotic handlers that are accidentally connected to a same semiconductor tester at the same time.

In an embodiment, an alarm is activated when the normally closed prevention relay opens.

In another embodiment, the modular multiplexing interface assembly includes a density circuit in the printed circuit multiplexing motherboard that allows for a multiple density configuration of multiplexing components of the printed circuit multiplexing motherboard.

In a further embodiment, the density circuit enables a four-pin device to share three vias and occupy a same area of opposite sides of the printed circuit multiplexing motherboard.

In an embodiment, the modular multiplexing interface assembly includes a multiplexing circuit in the printed circuit multiplexing motherboard that toggles two planes of the printed circuit multiplexing motherboard to alternately connect each robotic handler to a semiconductor tester in the automated semiconductor test equipment.

In another embodiment, the modular multiplexing interface assembly includes a multiplexing circuit in the printed circuit multiplexing motherboard that is configured with shared ground pins between multiplexed paths of digital signal paths, the shared ground paths never being shared at a same time.

In a further embodiment, in the multiplexing circuit configured with shared ground pins, there are twice as many digital signal paths as there are shared ground pins.

In an embodiment, there is a multiplexing circuit in the printed circuit multiplexing motherboard that is configured double density routing for high current switching components.

In another embodiment, solid state relays are paired into top and bottom layers of the printed circuit multiplexing motherboard and have some of their pins paired and shared on a common via.

In a further embodiment, two modular load boards are provided.

In an embodiment, more than two modular load boards are provided.

In another embodiment, a method is provided for using a modular multiplexing interface assembly for reducing semiconductor testing index time in automated semiconductor test equipment that uses robotic handlers. The method includes attaching a printed circuit multiplexing motherboard to the automated semiconductor test equipment, and attaching a modular load board to each of a plurality of robotic handler, each modular load board being detachably connected, electrically and mechanically, to a robotic handler. The method also includes providing a plurality of electrical cable bundles, each electrical cable bundle electrically connecting the printed circuit motherboard with a modular load board, wherein the plurality of electrical cable bundles are trace-length matched for a designated digital signal.

DETAILED DESCRIPTION

In view of the foregoing, the present disclosure, through one or more of its various aspects, embodiments and/or specific features or sub-components, is thus intended to bring out one or more of the advantages as specifically noted below. The present disclosure provides a description of an advanced methodology for configuring a modular multiplexing interface assembly that reduces or eliminates index time in automated semiconductor testing equipment, which is equipped with robotic handlers.

Figure 1:
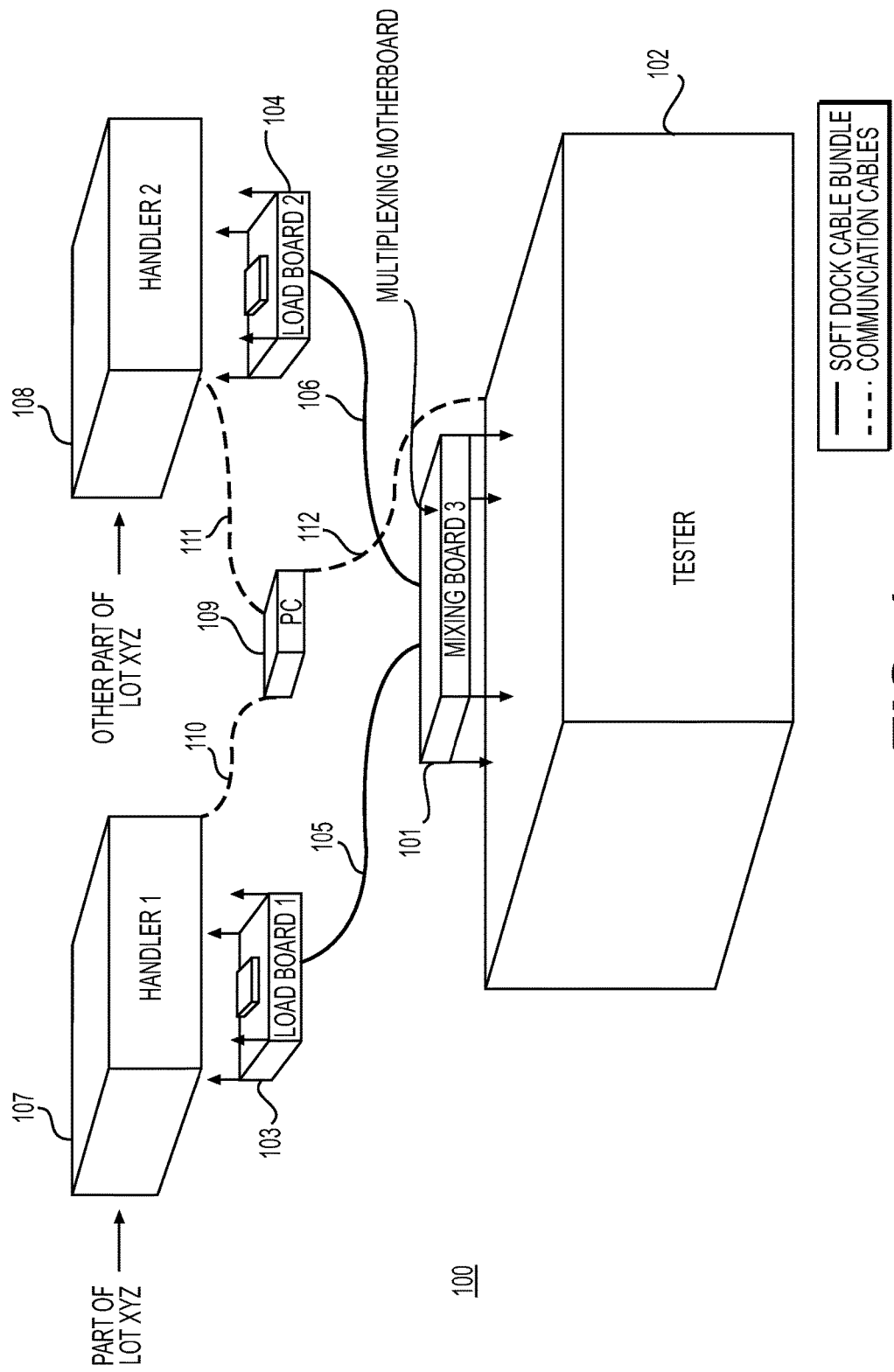
FIG. 1 provides an illustration of a multiplexed handler test cell.

FIG. 1 illustrates a multiplexed handler test cell 100 where a multiplexing motherboard 101 is used. The multiplexing mother board 101 is configured as a detachable module that may be easily attached to and removed from a semiconductor tester 102. The multiplexing motherboard 101 is in electrical communication with daughter load boards 103, 104 by the used of cable bundles 105, 106. The daughter load boards 103, 104 are attached to robotic "handler 1" 107 and robotic "handler 2" 108, respectively. The daughter load boards 103, 104 are also configured as detachable modules that may be easily attached to and removed from robotic "handler 1" 107 and robotic "handler 2" 108, respectively. The multiplexed handler test cell 100 also includes a computer 109 that is in electrical communication with the tester 102 by communication cable 112. The computer 109 is also in electrical communication with robotic "handler 1" 107 and robotic "handler 2" 108 by communication cables 110 and 111.

The multiplexing motherboard 101 and the related daughter load boards 103, 104 are the primary focus of the invention described herein. Normally, the multiplexing motherboard fully multiplexes all tester resources so that one design will work across all applications. Each application, however, typically requires a unique handler load board. Referring again to FIG. 1, there are design requirements for the multiplexing motherboard that must be implemented in order for the design to function efficiently and effectively across the widest range of tester configurations and architectures.

These design requirements include, but are not limited to the following considerations. The first design requirement is the trace-length matching of signal traces for each digital signal. Trace-length matching is required for testers that have only one timing calibration set for the application. This is commonly referred to as a Time-Domain-Reflectometry (TDR) timing calibration. If only one calibration data set is available, then both handler 1 and handler 2 trace-lengths must match so that the single TDR data set works the same on both paths to the handlers. The method is described as trace-length matching to a tolerance equal to or better than the propagation speed of the signal given the PCB dielectric times ⅙ of the signal rise or fall time, whichever is shorter. For example, if an FR4 dielectric has a propagation velocity of approximately 1 inch/160 ps, and the rise and fall times are both 1 ns, then trace-length matching should be less than or equal to:

$$1 \text{ inch}/176 \text{ ps} * \frac{1}{6} * 1000 \text{ ps} = 0.95 \text{ inches}.$$

The second design requirement is the provision of a safety circuit that prevents the multiplexing relays for a handler to actuate when the cable for that handler has become disconnected. The safety circuit usually is associated with what is commonly referred to as an interlock circuit. The interlock circuit connects the tester with the handler. If this circuit is broken or interrupted, then the tester cannot power up tester resources that may carry hazardous voltages. When there are two handlers, a special circuit is provided that distinguishes between the interlock circuits for the two handlers. If the cabling to one handler becomes disconnected, the disconnected handler is prevented from powering on while the other handler that is connected continues to operate properly.

Figure 2:
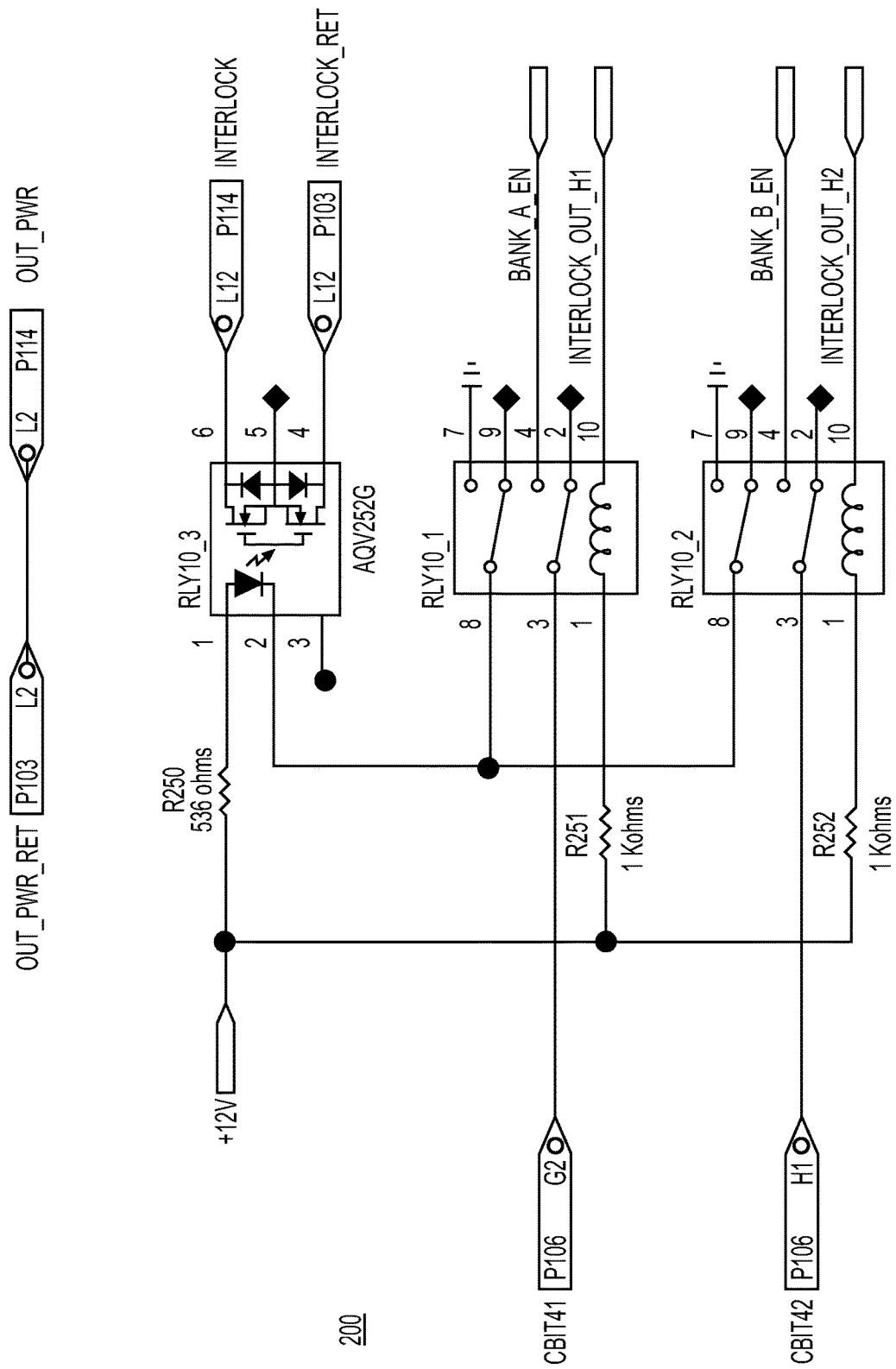
FIG. 2 provides an illustration of a dual handler interlock safety circuit.

FIG. 2 illustrates an embodiment of a dual handler interlock safety circuit 200. INTERLOCK_OUT_H1 is a signal that runs via cables connected to a Device Interface Board (DIB) mounted on handler 1, when the signal terminates to a ground connection that returns on the same cable to a ground on the multiplexing board mounted to the tester. Should the cable become disconnected, the circuit is broken and relay RLY10_1 is de-actuated and assumes the configuration as shown in FIG. 2. When the cable is connected, INTERLOCK_OUT_H1 is pulled to ground and RLY10_1 is actuated. In the actuated configuration, CBIT41 is passed through to BANK_A_EN and the multiplexing relays for handler 1 are controlled by CBIT41 as normal. The same description just given applies to INTERLOCK_OUT_H2 and handler 2. Together these circuits form a logical AND operation at relay RLY10_3, which will power down the hazardous tester resources when de-actuated. In the event that one handler becomes disconnected, the circuit disables power to that handler only, while allowing the connected handler to remain operational. In the event that both handlers become disconnected, RLY10_3 is de-actuated and all hazardous power is disabled and neither handler is allowed to connect. This is because RLY10_3 must be actuated in order for the INTERLOCK-INTERLOCK_RET (RETURN) circuit to be complete. This circuit is monitored by the tester and will cause the tester to power down hazardous resources when broken.

Table 1 provided below illustrates the logic implemented by the circuit of FIG. 2.

TABLE 1

Logic for Dual Handler Interlock Safety Circuit

| INTERLOCK_OUT_H1 | ground | 12 V | ground | 12 V |
|---|---|---|---|---|
| Power to handler 1 cables | enabled | disabled | enabled | disabled |
| INTERLOCK_OUT_H2 | ground | ground | 12 V | 12 V |
| Power to handler 2 cables | enabled | enabled | disabled | disabled |
| RLY10_3 | actuated | actuated | actuated | de-actuated |
| Tester INTERLOCK circuit | complete | complete | complete | broken |
| Hazardous Tester Power | enabled | enabled | enabled | disabled |

The third design requirement is the provision of a circuit that prevents both robotic handlers from becoming connected to the semiconductor tester at the same time. Although the user would never intentionally cause the condition where both robotic handlers become connected to the semiconductor tester at the same time, this condition could happen accidentally.

Figure 3:
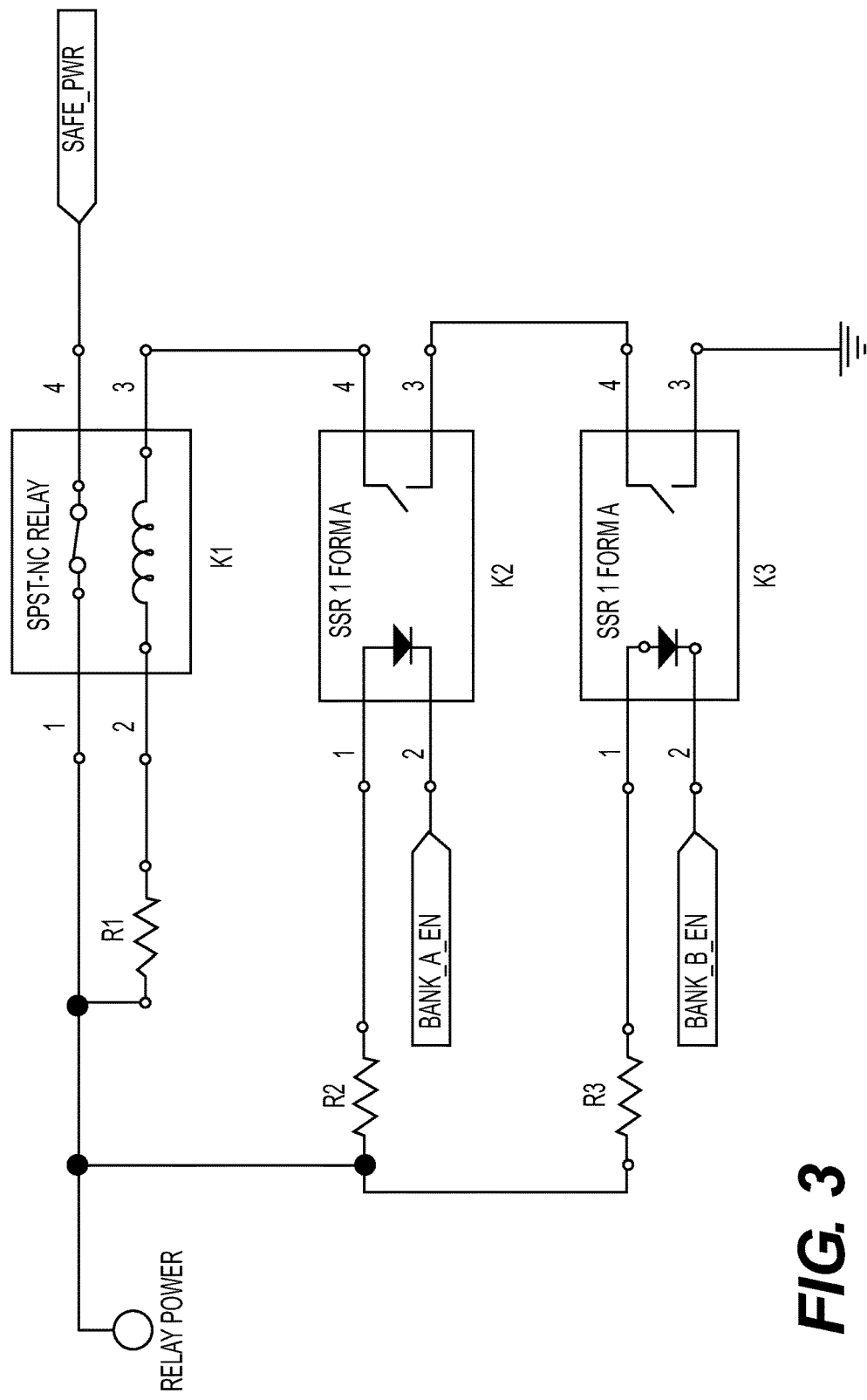
FIG. 3 shows a circuit to prevent overlapping handler connections to a semiconductor tester.

One embodiment of such a circuit is illustrated in FIG. 3, which shows an embodiment of a circuit 300 to prevent overlapping handler connections to a semiconductor tester. In the event that both banks of multiplexing components become enabled at the same time, relays K2 and K3 actuate at the same time. This, in turn, actuates K1. When K1 is actuated, the normally closed relay opens and disconnects power from the multiplexing relays. As the multiplexing relays are normally open (off), neither handler is able to connect. BANK_EN_A and BANK_EN_B could also be implemented using CBIT1 and CBIT2. It is contemplated that the condition where both banks of multiplexing relays are enabled at the same time would result in an alarm condition that alerts the user to the problem. This event could be detected, for example, by monitoring the node at pin 2 of K1. This node would drop from relay power to near ground potential when the alarm condition occurs.

Figure 4:
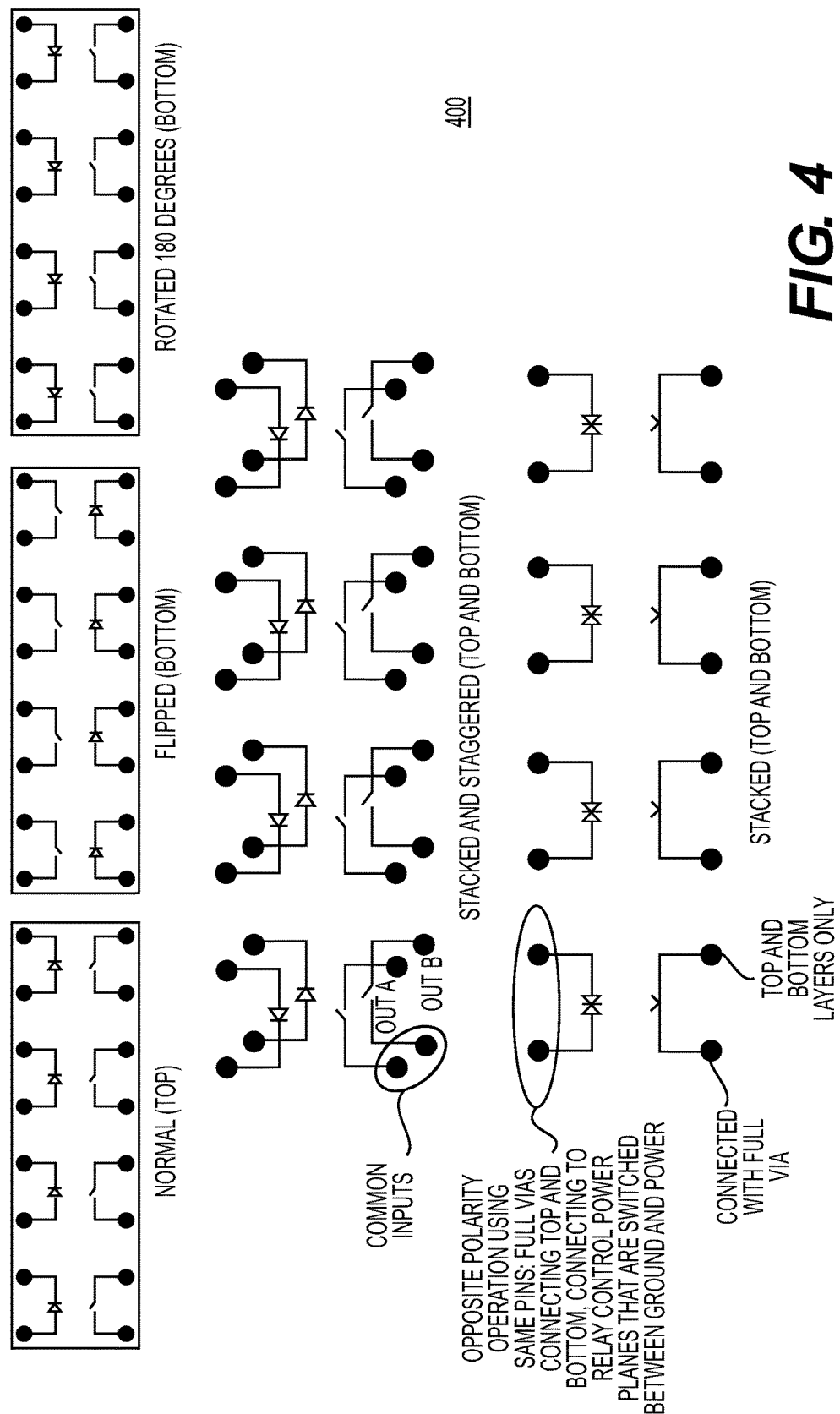
FIG. 4 provides an illustration of double density component placement of multiplexing components.

In addition to the design requirements just enumerated, there are other design features that are beneficial. The first additional design feature is the provision of a circuit that allows for a double density configuration of the multiplexing components. This method allows a four-pin device to share three vias and occupy the same area on opposite sides of the PCB. For instance, FIG. 4 provides an illustration 400 of double density component placement of multiplexing components, i.e., how components are placed on opposites sides of the PCB substrate.

Figure 5:
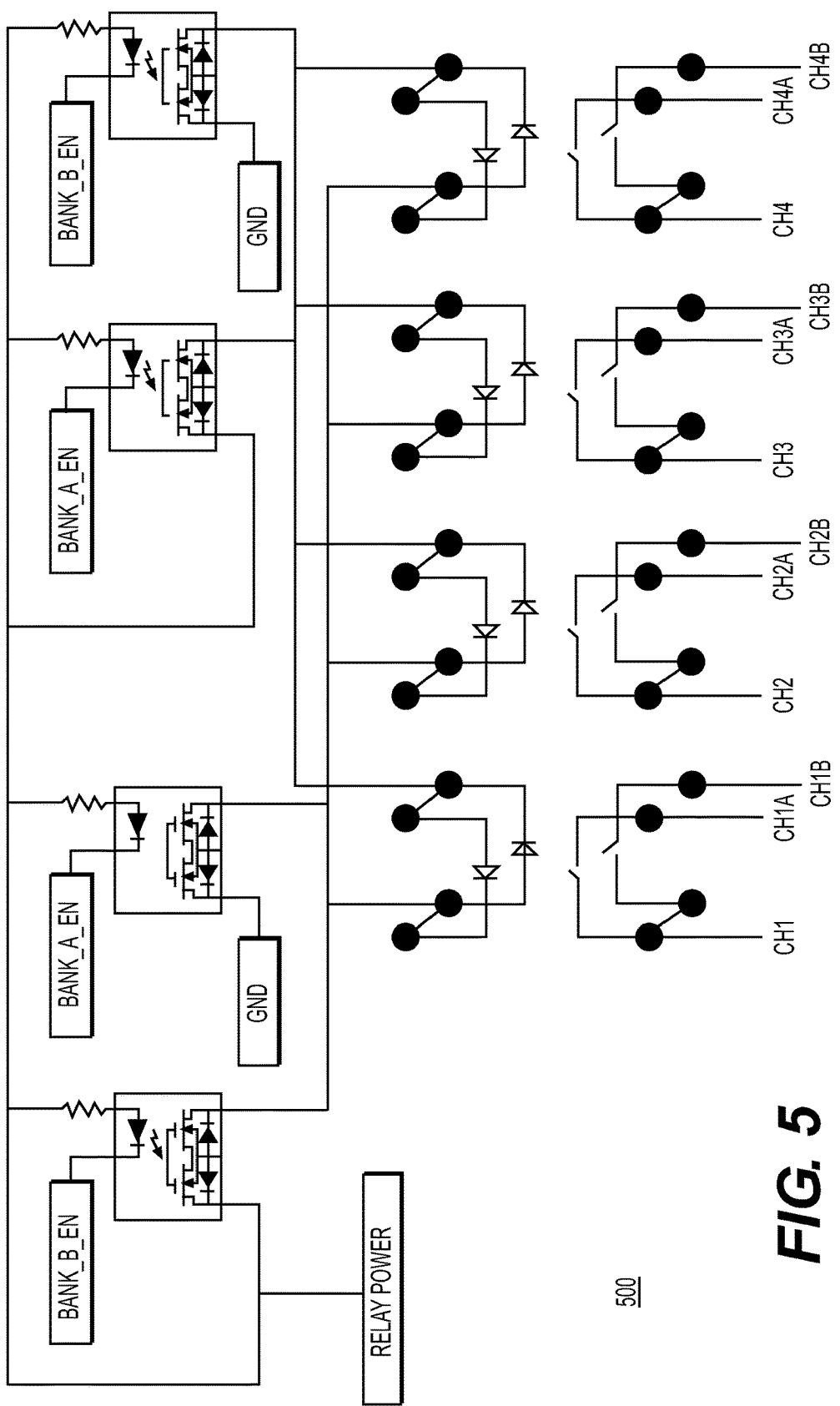
FIG. 5 illustrates the multiplexing of robotic handlers using full vias.

The second additional design feature is the provision of a multiplexing circuit that toggles two planes of the PCB between fixed voltage power and ground to alternately connect handler 1 and handler 2 to the tester. The method allows sharing of three vias between two switches. For instance, FIG. 5 provides an illustration 500 of the multiplexing of robotic handlers using full vias. In application, there would be a plurality of switching components paired up on top and bottom of the PCB. The design allows three of the four pins on the paired switches to be shared. This results in both cost savings and area savings. The fourth pin of each may be routed away to a location where a fourth via can route the signal as required. This eliminates the need for partial vias, which require a more expensive manufacturing process. As illustrated in FIG. 5, four pairs of multiplexing components alternately actuate under control of the signals BANK_A_EN (enable) and BANK_B_EN. The safety circuit of FIG. 3 prevents both signals from actuating at the same time. This prevents the condition of having a power source, Relay Power, shorted directly to ground. It is contemplated that fuses provide a second level of power supply protection.

Figure 6:
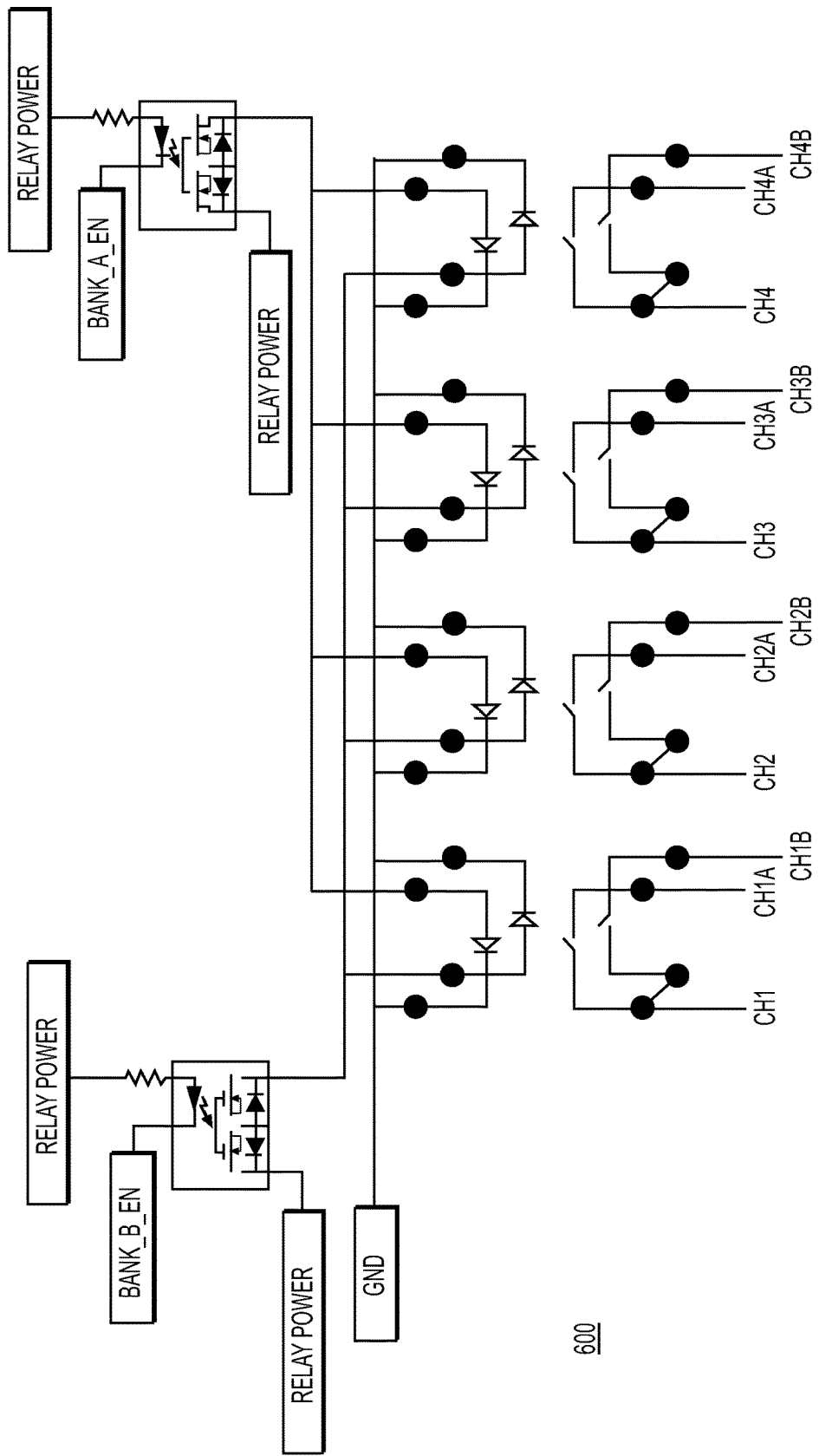
FIG. 6 illustrates the multiplexing of robotic handlers using partial vias and reduced control component count.

For comparison, FIG. 6 illustrates a similar circuit, but with a control scheme that supports only one shared via. More specifically, FIG. 6 provides an illustration 600 of the multiplexing of robotic handles using partial vias and having a reduced control component count. In this case, the control component count is reduced. Partial full vias are not allowed on the other three pins, as their function is different.

The third additional design feature is the inclusion of a digital signal pin assignment strategy that reduces the required number of ground pins for each signal pin. Best design practice dictates that for every digital signal pin on a multi-pin electrical connector, there must be a ground pin corresponding paired with every signal pin. It is furthermore understood that each ground pin should be adjacent to its corresponding signal pin. This is for reasons related to minimizing inductance. Inductance can, and typically does, degrade signal integrity. When designing interconnects to the multiplexing modules described herein, it is a first pass design rule to provide a ground pin for every signal pin. However, since the multiplexed signal paths are never active at the same time as guaranteed by the circuit of FIG. 3, there is an opportunity to share ground pins between multiplexed paths of the digital signal paths. Although the ground pins may be considered shared, they will never be shared at the same time. This presents an opportunity to significantly reduce the pin-count of the mating connectors between the multiplexing module and the motherboard attached to the tester.

Using the example illustrated in FIG. 6, a first pass design is illustrated in Table 2 and Table 3 provided below.

TABLE 2

| CH1A | signal |
| CH1A | ground |
| CH1B | signal |
| CH1B | ground |
| CH2A | signal |

TABLE 2-continued

| | |
|---|---|
| CH2A | ground |
| CH2B | signal |
| CH2B | ground |
| CH3A | signal |
| CH3A | ground |
| CH3B | signal |
| CH3B | ground |
| CH4A | signal |
| CH4A | ground |
| CH4B | signal |
| CH4B | ground |

TABLE 3

| | |
|---|---|
| CH1A | signal |
| CH1A, CH1B | ground |
| CH1B | signal |
| CH2A | signal |
| CH2A, CH2B | ground |
| CH2B | signal |
| CH3A | signal |
| CH3A, CH3B | ground |
| CH3B | signal |
| CH4A | signal |
| CH4A, CH4B | ground |
| CH4B | Signal |

Table 2 shows a practical connector pin assignment (8 grounds). Table 3 shows a preferred connector pin assignment (4 grounds). As can be seen by comparing Table 2 with Table 3, it is possible to reduce the ground pins for the multiplexed signal paths by 50%. The assignment of Table 3 also avoids having two active signals adjacent to each other. When any signal is active, there is always a corresponding return ground between it and any other active signal pin. For high pin count interconnects, this reduction in the number of required ground pins represents a significant savings in both cost and PCB area.

In another design configuration, the multiplexing module may include double density routing for the high current switching components. In this configuration, the key innovation is that the solid state relays (SSRs) are paired into top and bottom layer PCB components and have some, but not all, of their pins are paired and shared on a common via.

These circuits can be designed in layout to support high-current, low-impedance analog as well as high-current controlled-impedance digital signal paths.

Figure 7:
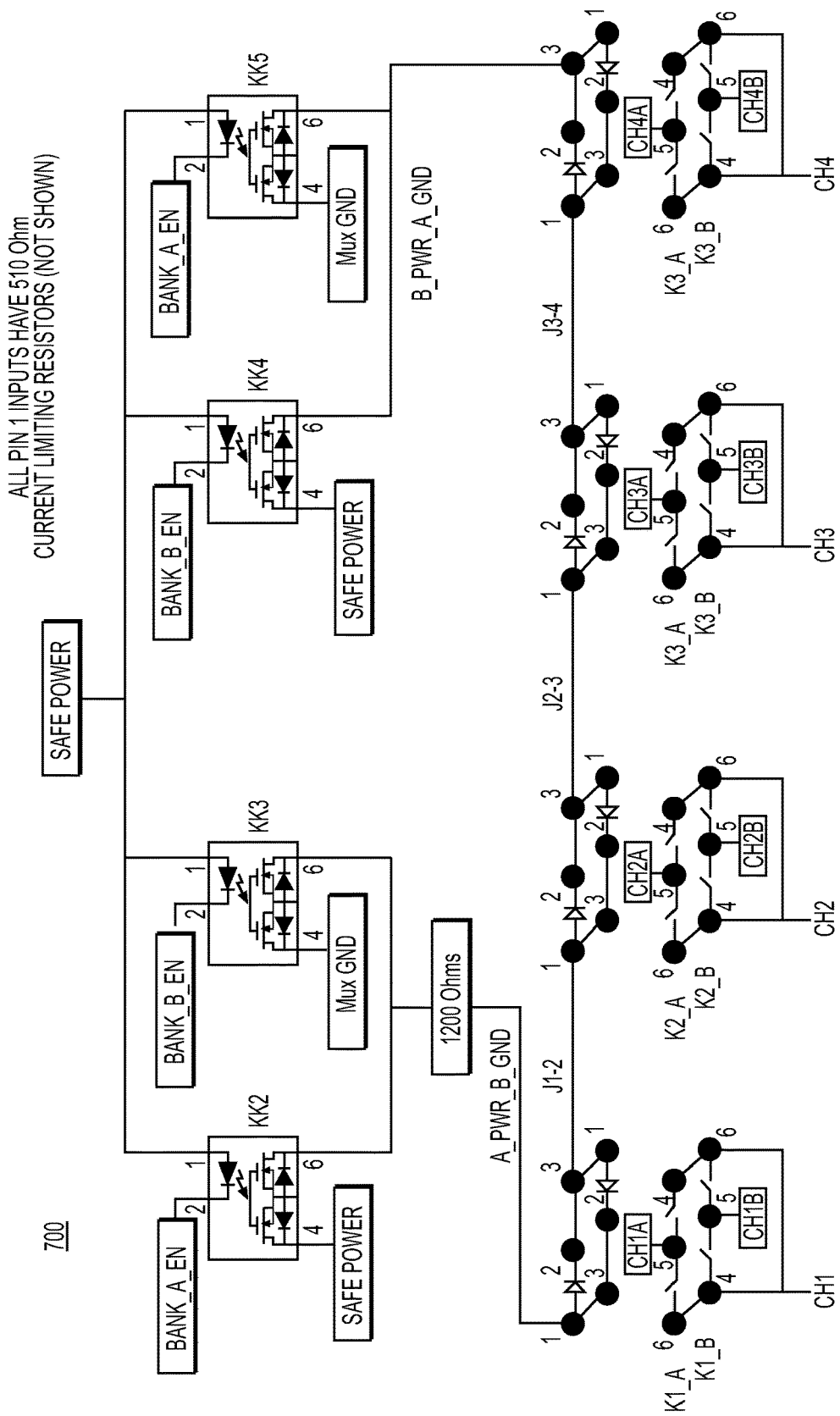
FIG. 7 illustrates double density routing for the high current switching components.

An illustration 700 of an embodiment that includes providing safe power in double density routing for high current switching components is provided in FIG. 7. In FIG. 7, for relay pairs K1_A and K1_B, a signal, CH1, is switched between two signal paths, CH1A and CH1B. The switching is actuated in an alternating manner by A_PWR_B_GND and B_PWR_A_GND. These control signals bias the diodes between pins 1 and 2 of the pair switches (designated by either an "A" or a "B"). The only allowed states are: both diodes are off, the diode on K_1A is on and the diode on K_1B is off, or the diode on K_1B is on and the diode on K_1A is off. The state where both diodes are on at the same time is never allowed by a circuit (not shown) that turns off Safe Power when BANK_A_EN and BANK_B_EN are enabled at the same time. In FIG. 7, the block of 4 channels is repeated 12 times in order to have 48 operational channels.

Figure 8:
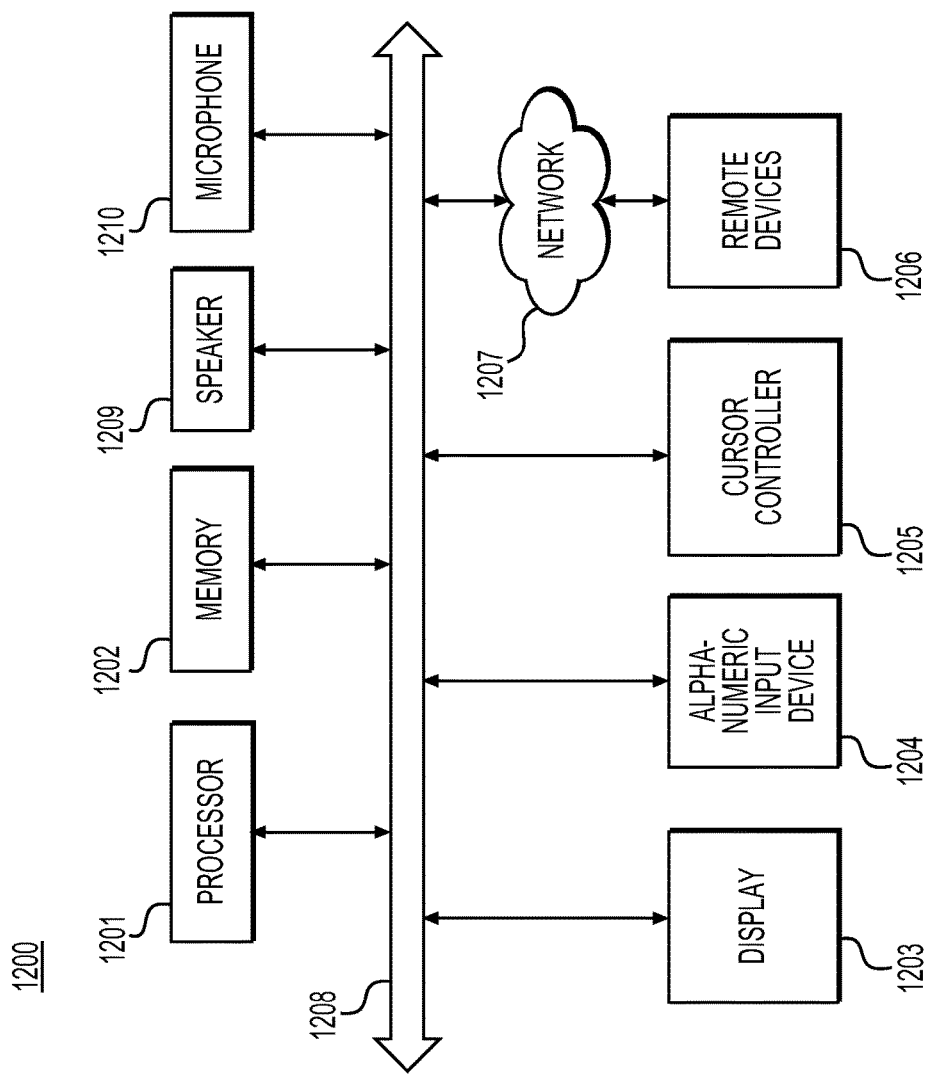
FIG. 8 illustrates an example of a computer that may be used in the semiconductor testing process described herein.

FIG. 8 illustrates an example of a computer 1200 that may be used in the semiconductor testing process that utilized automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 8, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A modular multiplexing interface assembly for reducing semiconductor testing index time in automated semiconductor test equipment that uses robotic handlers, the modular multiplexing interface assembly comprising:
    a printed circuit multiplexing motherboard configured as a detachable module that is detachably connected, electrically and mechanically, to the automated semiconductor test equipment;
    a plurality of modular load boards, each modular load board being configured as a detachable module that is detachably connected, electrically and mechanically, to respective robotic handlers; and
    a plurality of electrical cable bundles, each electrical cable bundle electrically connecting the printed circuit motherboard with one of the plurality of modular load boards,
    wherein the plurality of electrical cable bundles are trace-length matched by Time-Domain-Reflectometry to a tolerance equal to or greater than a propagation speed of a designated digital signal, given a dielectric of the printed circuit multiplexing motherboard, times approximately ⅙ of a shortest time of either a rise time or a fall time of the designated digital signal.

2. The modular multiplexing interface assembly of claim 1, further comprising:
    a safety circuit being assigned to a designated robotic handler that prevents multiplexing relays for the designated robotic handler to actuate when the electrical cable bundle associated with the designated robotic handler becomes disconnected from the printed circuit multiplexing motherboard.

3. The modular multiplexing interface assembly of claim 2,
    wherein the safety circuit assigned to the designated robotic handler is located in a interlock circuit that connects the automated semiconductor test equipment with the designated robotic handler, and the interlock circuit prevents the automated test equipment from powering up semiconductor tester resources that utilize electrical signals exceeding a predetermined voltage threshold.

4. The modular multiplexing interface assembly of claim 3,
wherein the safety circuit includes a special circuit, and the special circuit interfaces with the designated interlock circuit for each of the robotic handlers and prevents a disconnected robotic handler from powering on, while enabling each connected robotic handler to continue testing operations.

5. The modular multiplexing interface assembly of claim 1, further comprising:
a prevention circuit that prevents more than one robotic handler from being connected to a semiconductor tester of the automated semiconductor test equipment at a same time.

6. The modular multiplexing interface assembly of claim 5,
wherein the prevention circuit includes a normally closed prevention relay that opens and disconnects power from relays associated with robotic handlers that are accidentally connected to a same semiconductor tester at the same time.

7. The modular multiplexing interface assembly of claim 6,
wherein an alarm is activated when the normally closed prevention relay opens.

8. The modular multiplexing interface assembly of claim 1, further comprising:
a density circuit in the printed circuit multiplexing motherboard that allows for a multiple density configuration of multiplexing components of the printed circuit multiplexing motherboard.

9. The modular multiplexing interface assembly of claim 8,
wherein the density circuit enables a four-pin device to share three vias and occupy a same area of opposite sides of the printed circuit multiplexing motherboard.

10. The modular multiplexing interface assembly of claim 1, further comprising:
a multiplexing circuit in the printed circuit multiplexing motherboard that toggles two planes of the printed circuit multiplexing motherboard to alternately connect each robotic handler to a semiconductor tester in the automated semiconductor test equipment.

11. The modular multiplexing interface assembly of claim 1, further comprising:
a multiplexing circuit in the printed circuit multiplexing motherboard that is configured with shared ground pins between multiplexed paths of digital signal paths, the shared ground paths never being shared at a same time.

12. The modular multiplexing interface assembly of claim 11,
wherein in the multiplexing circuit configured with shared ground pins, there are twice as many digital signal paths as there are shared ground pins.

13. The modular multiplexing interface assembly of claim 1, further comprising:
a multiplexing circuit in the printed circuit multiplexing motherboard that is configured double density routing for high current switching components.

14. The modular multiplexing interface assembly of claim 13,
wherein solid state relays are paired into top and bottom layers of the printed circuit multiplexing motherboard and have some of their pins paired and shared on a common via.

15. The modular multiplexing interface assembly of claim 1,
wherein two modular load boards are provided.

16. The modular multiplexing interface assembly of claim 1,
wherein more than two modular load boards are provided.

17. A method for using a modular multiplexing interface assembly for reducing semiconductor testing index time in automated semiconductor test equipment that uses robotic handlers, the method comprising:
attaching a modular printed circuit multiplexing motherboard configured as a detachable module that is detachably connected, electrically and mechanically, to the automated semiconductor test equipment;
attaching a modular load board to a robotic handler, the modular load board configured as a detachable module that is detachably connected, electrically and mechanically, to the robotic handlers; and
providing a plurality of electrical cable bundles, each electrical cable bundle electrically connecting the printed circuit motherboard with the modular load board,
wherein the plurality of electrical cable bundles are trace-length matched by Time-Domain-Reflectometry to a tolerance equal to or greater than a propagation speed of a designated digital signal, given a dielectric of the printed circuit multiplexing motherboard dielectric, times approximately ⅙ of a shortest time of either a rise time or a fall time of the designated digital signal.

* * * * *